US005932895A

United States Patent [19]
Shen et al.

[11] Patent Number: 5,932,895
[45] Date of Patent: *Aug. 3, 1999

[54] SATURATED FULL COLOR STACKED ORGANIC LIGHT EMITTING DEVICES

[75] Inventors: Zilan Shen, Lawrenceville; Stephen R. Forrest; Paul Burrows, both of Princeton, all of N.J.

[73] Assignee: The Trustees of Princeton University, Princeton, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/858,994

[22] Filed: May 20, 1997

[51] Int. Cl.$^6$ .................................................. H01L 33/00
[52] U.S. Cl. .............................. 257/89; 259/98; 259/103; 259/40
[58] Field of Search ................................. 257/40, 88, 89, 257/98, 99, 103; 313/503, 506

[56] References Cited

U.S. PATENT DOCUMENTS

| | | | |
|---|---|---|---|
| 5,294,870 | 3/1994 | Tang et al. | 313/504 |
| 5,478,658 | 12/1995 | Dodabalapur et al. | 428/690 |
| 5,559,400 | 9/1996 | Nakayama et al. | 313/506 |
| 5,617,445 | 4/1997 | Jewell et al. | 372/96 |
| 5,674,636 | 10/1997 | Dodabalapur et al. | 428/690 |
| 5,682,402 | 10/1997 | Nakayama et al. | 372/99 |
| 5,703,436 | 12/1997 | Forrest et al. | 313/506 |
| 5,707,745 | 1/1998 | Forrest et al. | 257/89 |
| 5,757,139 | 5/1998 | Forrest et al. | 315/169.3 |

OTHER PUBLICATIONS

O.S. Heavens, Optical Properties of Thin Solid Films (Butterworth Scientific, London, 1955), pp. 46–95.

*Primary Examiner*—Minh Loan Tran
*Attorney, Agent, or Firm*—Kenyon & Kenyon

[57] ABSTRACT

Optical cavities in a stacked organic light emitting device (SOLEDS) can shift or attenuate the light emitted by the individual organic light emitting devices (OLEDs) in the stack. Interference caused by reflections within the stack, absorption, positioning of the light source, and the polarization of the emitted light can all determine how the spectra of the emitted light are affected by the SOLED structure. A detailed model that provides a good fit to measured SOLED emissions can be used to predict how a SOLED will affect light emitted by OLEDs. As a result, SOLED geometries that will optimize color saturation and external quantum efficiency can be predicted.

27 Claims, 10 Drawing Sheets

Backward Direction (-z)

Forward Direction (z)

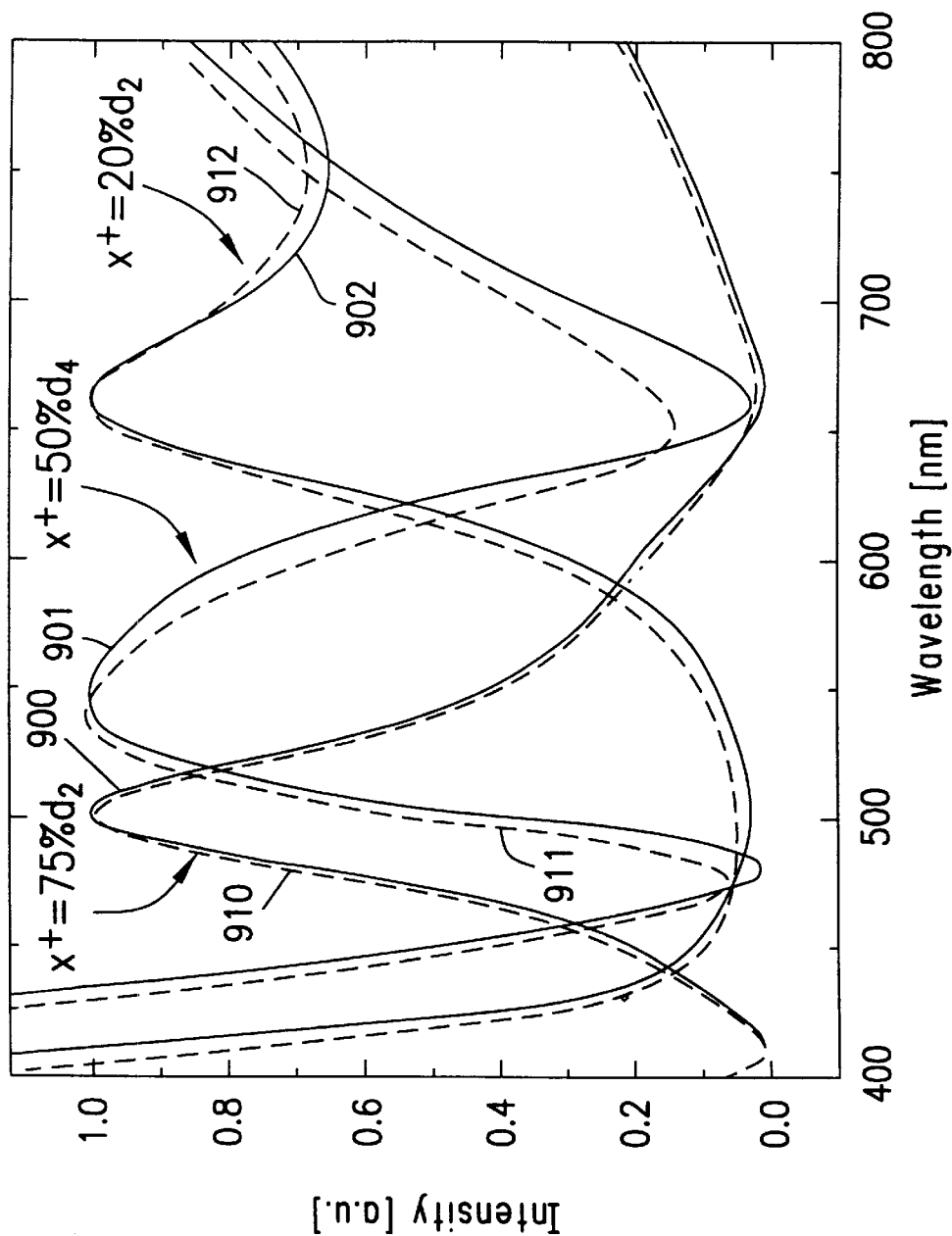

SATURATED FULL COLOR STACKED ORGANIC LIGHT EMITTING DEVICES

GOVERNMENT RIGHTS

This invention was made with Government support under Contract No. F33615-94-1-1414 awarded DARPA. The government has certain rights in this invention.

FIELD OF THE INVENTION

The present invention relates to a method of fabricating stacked organic light emitting devices (SOLEDs), and more particularly to the use of optical cavities to filter the light output of the SOLED so that color saturation and external quantum efficiency are optimized.

BACKGROUND OF THE INVENTION

Organic light emitting devices, which make use of thin film materials which emit light when excited by electric current, are becoming an increasingly popular technology for applications such as flat panel displays. A typical such organic emissive structure is referred to as a double heterostructure (DH) OLED, shown in FIG. 1A. In this device, a substrate layer of glass 10 is coated by a thin layer of indium-tin-oxide (ITO) 11. Next, a thin (100–1000 Å) organic hole transporting layer (HTL) 12 is deposited on the ITO layer 11. Deposited on the surface of HTL 12 is a thin (typically, 50 Å–1000 Å) emission layer (EL) 13. The EL 13 provides the recombination site for electrons injected from a 100–1000 Å thick electron transporting layer 14 (ETL) with holes from the HTL 12. Examples of ETL, EL and HTL materials are disclosed in U.S. Pat. No. 5,294,870, the disclosure of which is incorporated herein by reference.

Often, the EL 13 is doped with a highly fluorescent dye to tune color and increase the electroluminescent efficiency of the OLED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL 14, and a thick, high work function metal layer 17" such as gold (Au) or silver (Ag) on the Mg/Ag. The thick metal 17" is opaque. When proper bias voltage is applied between a top electrode 17 and contacts 15 and 16, light emission occurs from emissive layer 13 through the glass substrate 10. An OLED such as that of FIG. 1A typically has luminescent external quantum efficiencies of from 0.05% to 2% depending on the color of emission and the device structure.

Another known organic emissive structure referred to as a single heterostructure (SH) is shown in FIG. 1B. The difference between this structure and the DH structure is that multifunctional layer 13' serves as both EL and ETL. One limitation of the device of FIG. 1B is that the multifunctional layer 13' must have good electron transport capability. Otherwise, separate EL and ETL layers should be included as shown for the device of FIG. 1A.

Yet another known OLED device is shown in FIG. 1C, illustrating a typical cross sectional view of a single layer (polymer) OLED. As shown, the device includes a glass substrate 1 coated by a thin ITO layer 3. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg, Ca, or other conventionally used low work function metal.

OLEDs can be stacked to form a SOLED, as described in co-pending U.S. Pat. No. 5,707,745, which is incorporated by reference. The SOLED architecture is useful for fabricating low-voltage, color-tunable pixels with independent control of brightness and gray scale, and offers the advantages of minimum pixel size, maximum fill factor and a simple fabrication process. The three-color SOLED illustrates the unique versatility of organic thin film technology to construct highly complex and heterogeneous multilayer systems which are not possible to attain with conventional, inorganic semiconductor technologies. The SOLED pixel architecture can be used in full color flat panel display applications.

SUMMARY OF THE INVENTION

In accordance with the present invention, interference induced by discontinuities in the indices of refraction between different layers of material is used to advantage to cause a multi-layer SOLED structure to act as a filter that can reduce and/or shift the primary color emitted by each light emitting element of the SOLED. For example, if the strongest interference effects in a particular SOLED structure are due to particular electrode layers that reflect a significant proportion of incident light, those electrode layers can define a Fabry-Perot optical cavity that can significantly affect the frequency spectra and intensity of the light emitted by the SOLED. Choosing the size of the optical cavity, the positioning of the light emitting layers within the optical cavity, and which light emitting layers are within the cavity in accordance with the present invention allows color saturation and external quantum efficiency to be optimized with respect to certain predetermined requirements.

The SOLEDs of the present invention can be used in a wide variety of applications, including computer displays, informational displays in vehicles, television monitors, telephones, printers, illuminated signs, large-area screens and billboards.

BRIEF DESCRIPTION OF THE DRAWINGS

FIG. 9 shows exemplary transmission functions for a 700 nm optical cavity, accounting for the position of the light sources as well as for off-angle viewing.

DETAILED DESCRIPTION

Figure 2:
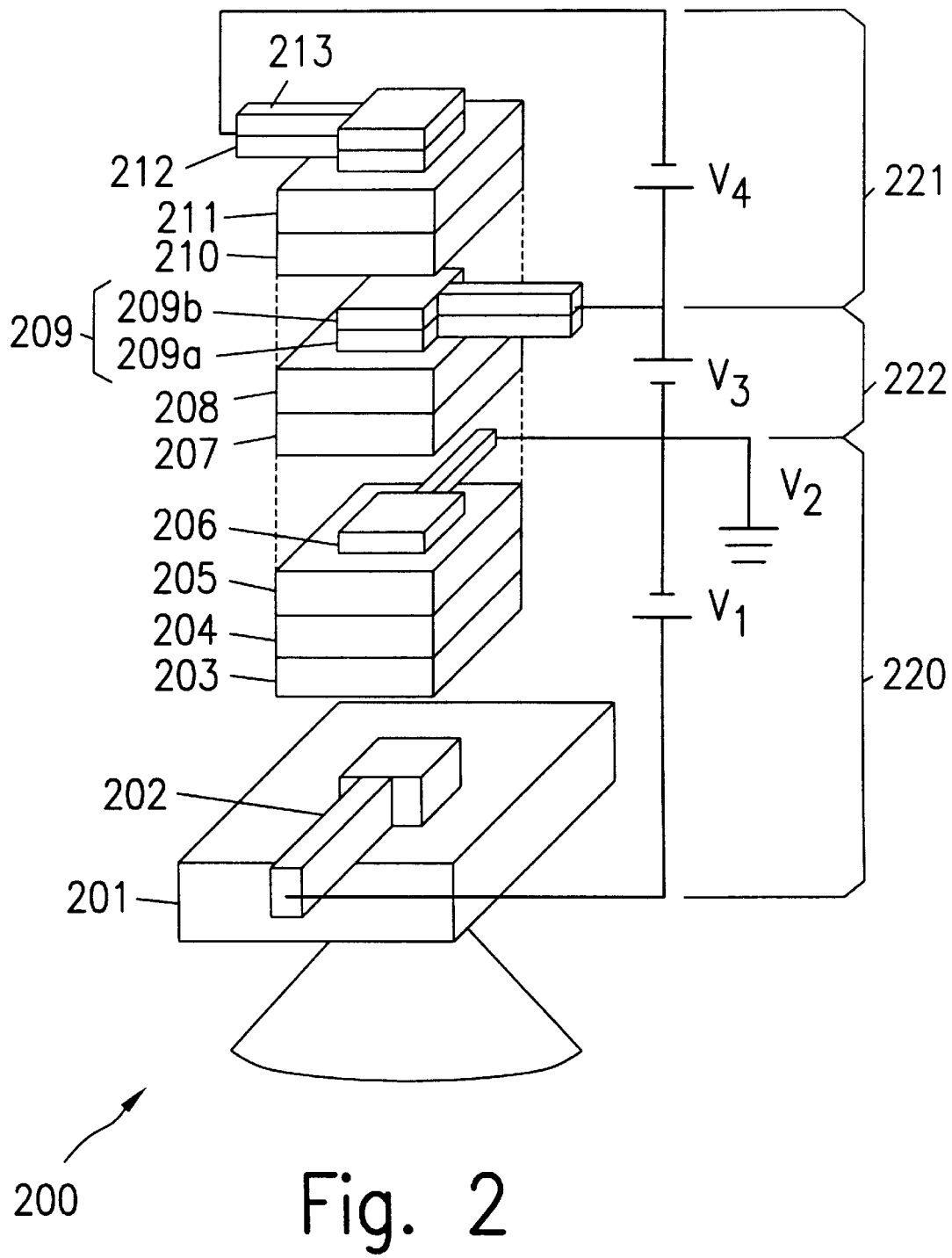
FIG. 2 is a schematic representation of a three color tunable SOLED in accordance with the present invention.

FIG. 2 is a schematic representation of a SOLED 200. SOLED 200 comprises three stacked OLEDs: a bottom OLED 220, which emits blue light, a middle OLED 221, which emits green light, and a top OLED 222, which emits red light. Each independently controllable OLED 220, 221 and 222 emits its characteristic color through the adjacent transparent organic layers, the contacts and glass substrate, allowing the entire device area to emit any mixture of the three primary colors. The compact stacked structure of SOLED 200 maximizes display resolution and optical fill factor. SOLED 200 may form the basis of a low voltage, full-color display. SOLED 200 is fabricated on substrate 201. Substrate 201 can be any suitable transparent material, such as glass, quartz, sapphire or plastic. The thickness and composition of substrate 201 is typically such that it does not cause a significant microcavity effect.

Figure 1A:
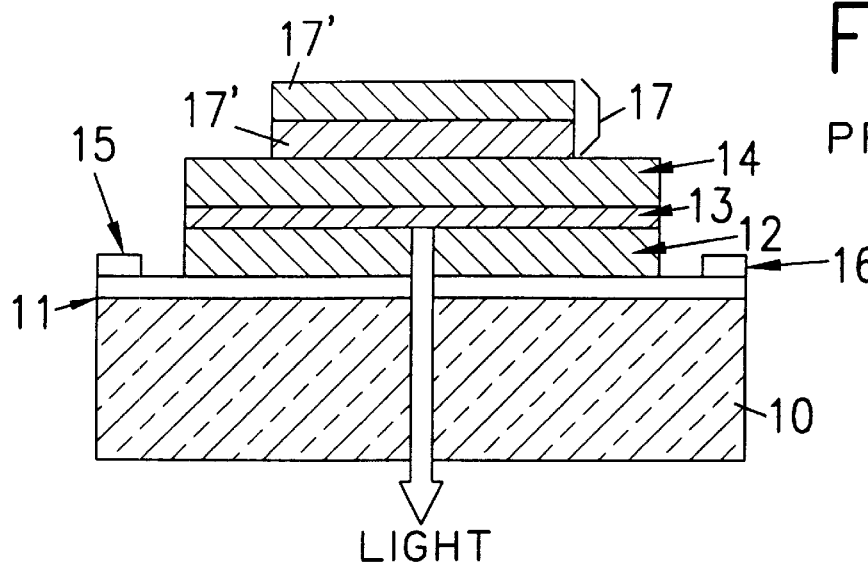
FIG. 1A is a cross sectional view of a typical organic double heterostructure light emitting device according to the prior art.

Bottom OLED 220 comprises a first electrode 202, a first hole transporting layer (HTL) 203, a first emission layer (EL) 204, a first electron transport layer (ETL) 205 and a second electrode 206. When a voltage is applied across first electrode 202 and second electrode 206, first electrode 202 injects holes into first HTL 203, while second electrode 206 injects electrons into ETL 205. The holes are transported across HTL 203 to EL 204, while the electrons are transported across ETL 205 to EL 204. The holes combine with the electrons in EL 204, and EL 204 emits light. Because there are separate HTL, EL and ETL layers, bottom OLED 220 is a double heterostructure OLED similar to that of FIG. 1A.

Figure 1B:
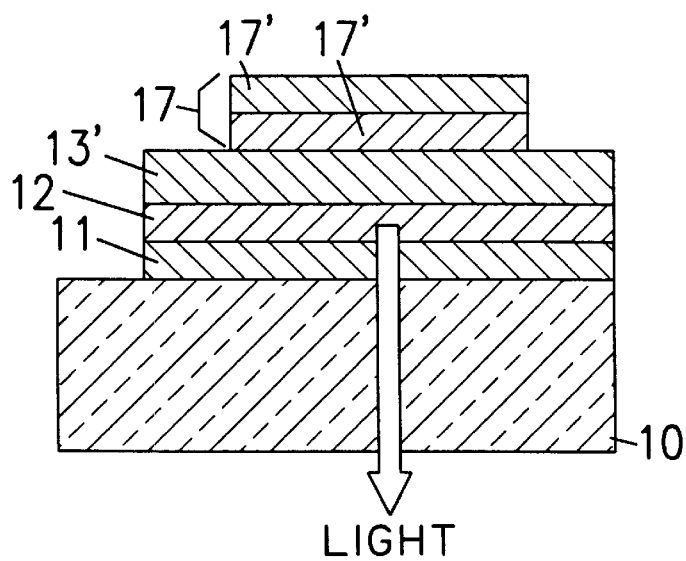
FIG. 1B is a cross sectional view of a typical organic single heterostructure light emitting device according to the prior art.
Figure 1C:
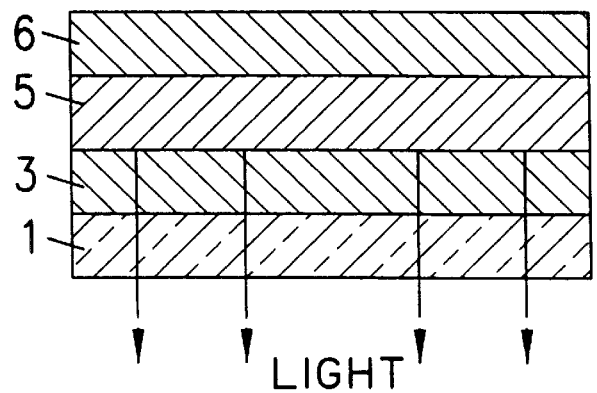
FIG. 1C is a cross sectional view of a known single layer polymer LED structure according to the prior art.

Middle OLED 221 comprises second electrode 206, second EL 207, second HTL 208 and third electrode 209. Middle OLED 221 shares second electrode 206 with bottom OLED 220. When a voltage is applied across second electrode 206 and third electrode 209, second electrode 206 injects electrons into second EL 207, while third electrode 209 injects holes into ETL 205. The holes are transported across HTL 208 to EL 207. The holes combine with the electrons in EL 207, and EL 207 emits light. Because EL 207 also serves as an ETL, middle OLED 221 is a single heterostructure OLED similar to that of FIG. 1B. Because second HTL 208 is on top of second EL 207 and current flows from third electrode 209 to second electrode 206 during operation of middle OLED 221, as contrasted with the OLED of FIG. 1B, middle OLED 221 is referred to as an organic inverted light emitting device (OILED). The inverted configuration of the middle OLED 221 in a stack of OLEDs otherwise not inverted substantially reduces the total drive voltage requirements for a compound SOLED-based flat panel display compared to devices without an inverted middle element.

Top OLED 222 comprises third electrode 209, third HTL 210, third EL 211, and fourth electrode 212. Top OLED 222 is a single, uninverted, heterostructure OLED, that functions in a manner similar to that of middle OLED 221. Top OLED 222 shares third electrode 209 with middle OLED 221.

Table 1 summarizes the materials and thicknesses used in SOLED 200, as well as parameters used in modeling the filtering effect of SOLED 200.

TABLE 1

| OLED 200 | Material | Thickness (Å) | n (R) | n (I) | Optical Path (Å) |
|---|---|---|---|---|---|
| 1st HTL 203 | α-NPD | 618 | 1.77 | 0 | 1094.18 |
| 1st EL 204 | KB-1 | 500 | 1.72 | 0 | 860.00 |
| 1st ETL 205 | Alq3 | 150 | 1.72 | 0 | 258.00 |
| 2nd elect. 206 | Mg; Ag | 120 | 0.13 | −0.3 | 15.60 |
| 2nd EL 207 | Alq3 | 500 | 1.72 | 0 | 860.00 |
| 2nd HTL 208 | a-NPD | 300 | 1.77 | 0 | 531.00 |
| 3rd elect. 209a | PTCDA | 100 | 2.1 | 0 | 210.00 |
| 3rd elect. 209b | ITO, 5w | 250 | 2.2 | 0 | 550.00 |
| 3rd elect. 209b | ITO, 45w | 400 | 2.2 | 0 | 880.00 |
| 3rd HTL 210 | a-NPD | 618 | 1.77 | 0 | 1094.18 |
| 3rd EL 211 | Alq3-TPP | 500 | 1.72 | 0 | 860.00 |
| 4th Elect. 212 | Mg; Ag | 1500 | 0.13 | −0.3 | 195.00 |
| Reflective Cap 213 | Ag | 500 | 0.13 | −0.3 | 65.00 |
| Total Optical Path | | | | | 7212.96 | n is the index of refraction, where (R) and (I) refer to the real and imaginary components. The optical path length of a material is the thickness multiplied by the real component of the index of refraction. Several of the layers, such as first ETL 205 and third electrode 209a, serve to protect organic layers such as first EL 204 and second HTL 208 from exposure to other layers, such as second electrode 206 and third electrode 209b. Third electrode 209b is deposited in two steps: first slowly at a low power of 5 watts, to avoid damaging underlying layers, and later more quickly at a power of 45 watts, after a layer of ITO sufficient to protect underlying layers has been deposited. $Alq_3$ refers to tris (8-hydroxyquinoline) aluminum, α-NPD refers to 4,4'-bis [N-(1-napthyl)-N-phenyl-amino]biphenyl, PTCDA refers to 3,4,9,10-perylenetracarboxylic dianhydride, ITO refers to indium-tin oxide, TPP refers to 5,10,15,20 tetraphenyl-21H, 23H-porphine, and $Alq_3$:TPP refers to $Alq_3$ doped with TPP by coevaporation.

Figure 3A:
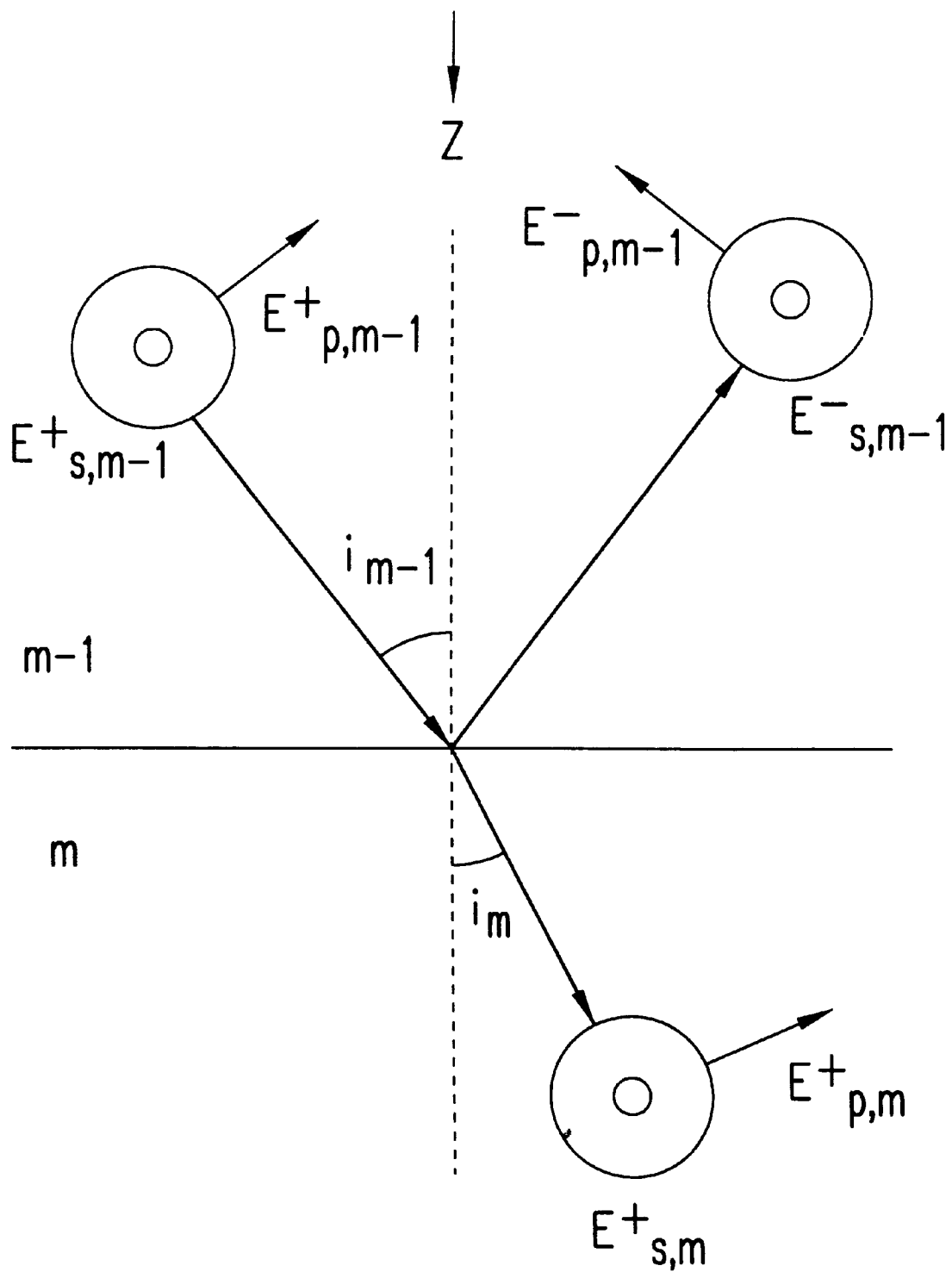
FIGS. 3a and 3b are schematic representations of light propagating within a multi-layer structure.

FIG. 3a is a schematic view of a light beam incident, at an angle of $i_{m-1}$, from medium m−1 to medium m. s and p represent the polarizations of the light beam. E represents the amplitude of the electric field of the light beam. A+superscript refers to a beam traveling in the positive z-direction, while a—superscript refers to a beam traveling in the negative-z direction.

Figure 3B:
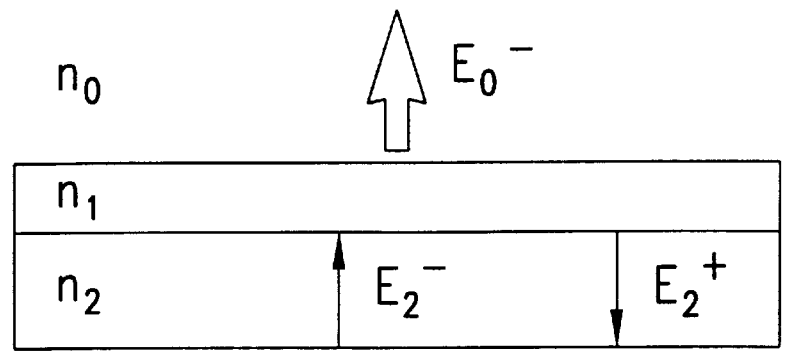
Figure 3B:
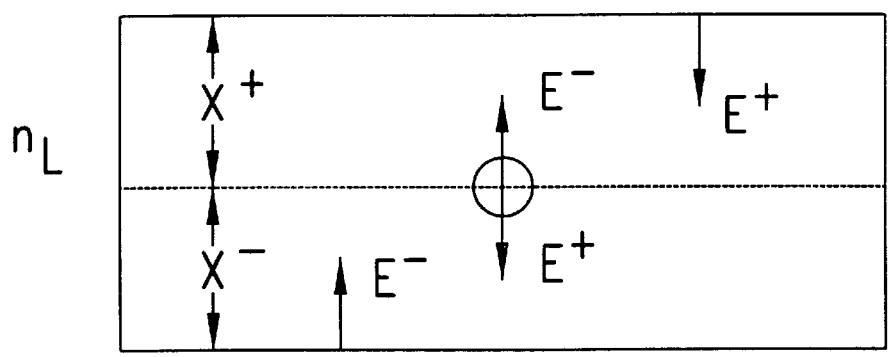
Figure 3B:
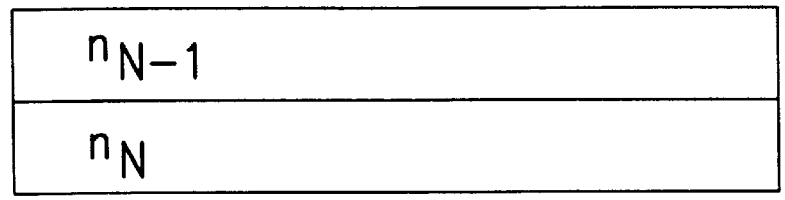
Figure 3B:
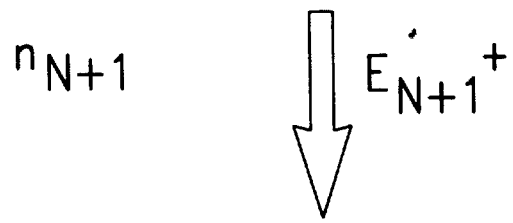

FIG. 3b is a schematic view of an N layer structure. Subscripts are used to denote each layer. Layer L is the light emitting layer.

Assuming the SOLED is composed of isotropic media, the optical characteristic of a material j can be described by $n_j=\underline{n}_j-i\kappa_j$, where $\underline{n}_j$ is the index of refraction, and $\kappa_j=\alpha_j\lambda/4\pi$, where λ is the wavelength, and $\alpha_j$ is the absorption coefficient of the material at λ.

As shown in FIG. 3a, at the interface between two layers, light incident from medium m−1 to medium m at an angle of $i_{m-1}$ will be both reflected and refracted. Depending on the incident polarization, the reflectivity (r) and transmittance (t) for the complex electric field are:

$$r_{p,m-1,m} = \frac{E^-_{m-1\,p}}{E^+_{m-1\,p}} = \frac{\tan(i_{m-1} - i_m)}{\tan(i_{m-1} + i_m)} = \frac{n_m \cos(i_{m-1}) - n_{m-1}\cos(i_m)}{n_m \cos(i_{m-1}) + n_{m-1}\cos(i_m)} \quad (5a)$$

$$r_{s,m-1,m} = \frac{E^-_{m-1\,s}}{E^+_{m-1\,s}} = \frac{\sin(i_{m-1} - i_m)}{\sin(i_{m-1} + i_m)} = \frac{n_{m-1}\cos(i_{m-1}) - n_m \cos(i_m)}{n_{m-1}\cos(i_{m-1}) + n_m \cos(i_m)} \quad (5b)$$

$$t_{p,m-1,m} = \frac{E^+_{m-1\,p}}{E^+_{mp}} = $$
$$\frac{2\sin(i_m)\cos(i_{m-1})}{\sin(i_{m-1}+i_m)\cos(i_{m-1}-i_m)} = \frac{2n_{m-1}\cos(i_{m-1})}{n_m\cos(i_{m-1}) + n_{m-1}\cos(i_m)} \quad (5c)$$

$$t_{s,m-1,m} = \quad (5d)$$
$$\frac{E^+_{m-1\,s}}{E^+_{ms}} = \frac{2\sin(i_m)\cos(i_{m-1})}{\sin(i_{m-1}+i_m)} = \frac{2n_{m-1}\cos(i_{m-1})}{n_m\cos(i_{m-1}) + n_{m-1}\cos(i_m)}$$

where superscript "+" denotes light propagating along the z direction and "−" denotes light propagating along the −z direction, subscripts "m" and "m−1" stand for electric fields in medium "m" and "m−1", respectively, and subscript "S" and "p" stand for two polarization directions, as illustrated in FIG. 3a. Here $$n_{m-1}\sin(i_{m-1}) = n_m \sin(i_m) \quad (5e)$$

Thus for both polarization (s and p) directions:

$$r_{m-1,m,m} = -r_{m-1,m} \quad (6a)$$

$$t_{m-1,m} = t_{m-1,m} n_m \cos(i_{m-1})/n_m \cos(i_m) \quad (6b)$$

Consider N layers with thicknesses $d_1, d_2, d_3, \ldots d_N$, as shown in FIG. 3b. In a layer labeled m, (where m=0,1,2, ... N+1), which does not emit light, the electric and magnetic fields for both s and p-polarization is a combination of two counter-propagating light waves:

$$E_m = E^+_m \exp[-ik_m(z - D^+_m)] + E^-_m \exp[ik_m(z - D^-_m)] \quad (7a)$$

where $$k_m = 2\pi n_m/\lambda, \quad (7b)$$

and $$D^+_m = \sum_{j=1}^{m-1} d_j \quad (7c)$$

$$D^-_m = \sum_{j=1}^{M} d_j = \sum_{j=1}^{n} d_j - \sum_{j=m+1}^{m} d_j \quad (7d)$$

Defining $$\delta_j = k_j d_j \quad (8)$$

The boundary conditions then give:

$$[E^+_{m-1,p}\exp(-\delta_{m-1}) - \quad (9a)$$
$$E^-_{m-1,p}]\cos(i_{m-1}) = [E^+_{m,p} - E^-_{m,p}\exp(-\delta_m)]\cos(i_m)$$

$$E^+_{m-1,s}\exp(-\delta_{m-1}) + E^-_{m-1,s} = E^-_{m,s} + E^+_{m,s}\exp(-\delta_m) \quad (9b)$$

$$[E^+_{m-1,p}\exp(-\delta_{m-1}) + \quad (9c)$$
$$E^-_{m-1,p}]n_{m-1} = [E^+_{m,p} + E^-_{m,p}\exp(-\delta_m)]n_m$$

$$[E^-_{m-1,p} - E^+_{m-1,p}\exp(-\delta_{m-1})]n_{m-1}\cos(i_{m-1}) = \quad (9d)$$
$$[E^-_{m,p}\exp(-\delta_m) - E^+_{m,p}]n_m\cos(i_m)$$

or $$\begin{pmatrix} E^+_{m-1} \\ E^-_{m-1} \end{pmatrix} = c^+_{m-1,m}\begin{pmatrix} E^+_m \\ E^-_m \end{pmatrix} \quad (10a)$$

where $$c^+_{m-1,m} = \frac{1}{t_{m-1,m}}\begin{bmatrix} \exp(i\delta_{m-1}) & r_{m-1,m}\exp(i\delta_{m-1} - i\delta_m) \\ r_{m-1,m} & \exp(-i\delta_m) \end{bmatrix} \quad (10b)$$

where the values of t and r depend on the polarization of the light wave.

Note the definition of matrix c is different from the standard conventions taken by Heavens. O. S. Heavens, Optical properties of Thin Solid Films (Butterworth Scientific, London, 1955). By defining electric field (Eq. 7) and matrix c (Eq. 10) this way, the calculation is symmetric for light emit in both the z and the −z directions. For example, we now have, $$\begin{pmatrix} E^+_m \\ E^-_m \end{pmatrix} = c^+_{m,m-1}\begin{pmatrix} E^+_{m-1} \\ E^-_{m-1} \end{pmatrix} \quad (11a)$$

where $$c^+_{m,m-1} = (c^+_{m-1,m})^{-1} = \frac{1}{t_{m,m-1}}\begin{bmatrix} \exp(-i\delta_{m-1}) & r_{m,m-1} \\ r_{m,m-1}\exp(i\delta_m - i\delta_{m-1}) & \exp(i\delta_m) \end{bmatrix} \quad (11b)$$

The expression is different when there is light emission from within a layer. For this case, consider a layer L, where photons are emitted from a molecule distance $x^+$ below the L−1, L interface, and $x^-$ above the L, L+1 interface, such that $d_L = x^+ + x^-$, as illustrated in FIG. 3b. Defining $$\delta^\pm = k_L x^\pm \quad (12)$$

we have:

$$E^\pm = E^\pm_{emit} + E^\pm_L \exp(-i\delta^\pm) \quad (13)$$

$E^+_{emit}$ and $E^-_{emit}$ represent the emitted photon into the forward and backward directions from the light source. In this case, $E^+_{emit} = E^-_{emit}$ since the spontaneous emission is usually isotropic, and $E^+$ and $E^-$ include the emitted and all other light transmitted and reflected by the microcavity. Thus:

$$\begin{pmatrix} E^+ \\ E^-_L \end{pmatrix} = \quad (14a)$$
$$c^+_{L,L+1} \ldots c^+_{N,N+1}\begin{pmatrix} E^+_{N=1} \\ 0 \end{pmatrix} = \begin{pmatrix} A_1 & B_1 \\ C_1 & D_1 \end{pmatrix}\begin{pmatrix} E^+_{N+1} \\ 0 \end{pmatrix} = \begin{pmatrix} A_1 \\ C_1 \end{pmatrix}E^+_{N+1}$$

and $$\begin{pmatrix} E^+_L \\ E^-_L \end{pmatrix} = \quad (14b)$$
$$(c^+_{L-1,L})^{-1} \ldots (c^+_{0,1})^{-1}\begin{pmatrix} 0 \\ E^-_0 \end{pmatrix} = \begin{pmatrix} A_2 & B_2 \\ C_2 & D_2 \end{pmatrix}\begin{pmatrix} 0 \\ E^-_0 \end{pmatrix} = \begin{pmatrix} B_2 \\ D_2 \end{pmatrix}E^-_0$$

Combining Eqs. 12–14 yields the light emitted from the top and the bottom of the multilayer structures:

$$E_0^+ = [A_1 E_{emit}^- + C_1 \exp(-i\delta)E_{emit}^+]/[A_1 D_2 - B_1 C_2 \exp(-i\delta_L)] \quad (15a)$$

$$E_{N-1}^+ = [D_2 E_{emit}^+ + B_2 \exp(-i\delta^+)E_{emit}^-]/[A_1 D_2 - B_2 C_1 \exp(-i\delta_L)] \quad (15b)$$

where the light intensities emitted from the top and bottom surfaces of the stacked device are thus $I_{top} = |E^-_0|^2$ and $I_{bot} = |E^+_{N+1}|^2$.

If the emitting sources (or molecules) are distributed in layer L with a density of $p(z)$ $1/\tau(z)$, then:

$$E^-_0 = \int_{D^-_L}^{D_L} dz p(z) \frac{A_1 E^-_{emit}(z) + C_1 E^+_{emit}(z) \exp[-i\delta^-(z)]}{A_1 D_2 - B_2 C_1 \exp[-i\delta_L]} \quad (16a)$$

and $$E^+_{N+1} = \int_{D^-_L}^{D_L} dz p(z) \frac{D_2 E^+_{emit}(z) + C_2 E^-_{emit}(z) \exp[-i\delta^+(z)]}{A_1 D_2 - B_1 C_2 \exp[-i\delta_L]} \quad (16b)$$

If the light is incident along the z directions from outside the stack, we have:

$$\begin{pmatrix} E^+_0 \\ E^-_0 \end{pmatrix} = c^+_{0,1} \ldots c^+_{N,N+1} \begin{pmatrix} E^+_{N+1} \\ 0 \end{pmatrix} = \begin{pmatrix} A_0 & B_0 \\ C_0 & D_0 \end{pmatrix} \begin{pmatrix} E^+_{N+1} \\ 0 \end{pmatrix} = \begin{pmatrix} A_0 \\ C_0 \end{pmatrix} E^+_{N+1} \quad (17)$$

For this case, the transmittance intensity is $$T_1 = I_{N+1}^{30} / I_0^+ = |E_{N+1}^+|^2 / |E_0^+|^2 = 1/|A_0|^2 \quad (18a)$$

where I is the light intensity. Since the energy flux, W, is defined as $W=IS$, where S is the cross-section area of the light beam (and depends on the incident angles), the energy flux transmittance is different from that of the light intensity:

$$T_E = W^+_{N+1}/W^+_o = |E^+_{N+1}|^2/|E^+_o|^2 = \cos(i_{N+1})/\cos(i_o)|A_o|^2. \quad (18b)$$

On the other hand, the intensity reflectivity equals the energy reflectivity, and is $$R_I = R_E = |E^-_o|^2/|E^+_o|^2 = |C_o|^2/|A_o|^2. \quad (18c)$$

Similar results are found for light propagating from the other direction.

For a SOLED, the strongest interference effects are due to the two reflective mirrors formed by the Mg:Ag layers. Therefore, to the first order, the shifted emission spectra from the SOLED can be fitted by ignoring absorption, and assuming a Fabry-Perot cavity formed by electrode 206 and electrode 212 with reflective cap 213. Light is assumed to be emitted from outside the cavity such that the spectra fit of the middle and the top elements are $$I(\lambda) = T(\lambda) Io(\lambda), \quad (19)$$

where $I_o(\lambda)$ is the measured spectrum for a comparable discrete device whose layer thicknesses are those employed in a sub-element of the SOLED, and $T(\lambda)$ is the transmittance of the single layer cavity.

In this case, the problem is reduced to finding the transmittance of a single layer structure with no loss, where the analytical expression can be found using Eq. 18. For normal incidence, ($i_o = 0$)

$$R_I = R_E = \frac{r_{01}^2 + r_{12}^2 + 2 r_{01} r_{12} \cos(2\delta_1)}{1 + r_{01}^2 r_{12}^2 + 2 r_{01} r_{12} \cos(\delta_1)} \quad (20a)$$

and $$T_I = T_E = \frac{t_{01}^2 t_{12}^2 n_2 / n_0}{1 + r_{01}^2 r_{12}^2 + 2 r_{01} r_{12} \cos(2\delta_1)} \quad (20b)$$

$$= \frac{1}{1 + \frac{(r_{01} + r_{12})^2 - 4 r_{01} r_{12} \sin^2(\delta_1)}{(1 - r_{01}^2)(1 - r_{12}^2)}}$$

define the reflectivity of intensity from layer m to m+1 as $$R_{m,m+1} = R_{m+1,m} = |r_{m,m+1}|^2 \quad (22)$$

The output spectra of the SOLED can then be roughly fitted 15 using Eq. 20b. For a cavity with an optical path length of $D_o$, the peaks of the transmission are at $\lambda = 2D_0$, $D_0$, $2D_0/3$, $D_0/2$, etc. Varying from growth to growth, the reflectance of the semitransparent contact is sensitive to the Mg:Ag ratio, where its value ranges from 40% to 70%.

Note that constant values of the indices of refraction of each layer are assumed throughout the visible spectral region without considering color dispersion. In fact, the index of refraction away from the absorption region follows Cauchy's Equation, as:

$$n = A + B/\lambda^2 + C/\lambda^4 \quad (23)$$

That is, n increases at shorter wavelengths. For example, $n_{ITO}(\lambda=13000 \text{ Å})=2.02$, $n_{ITO}(\lambda=8300 \text{ Å})=2.08$, and $n_{ITO}(\lambda=6330 \text{ Å})=2.18$. From these data, we extrapolate that $n(\lambda=5000 \text{ Å})=2.32$, a 6% increase from $n(\lambda=6330 \text{ Å})$. Thus, the fit for the shorter wavelength element (e.g. the middle green element) should correspond to a transmission peak at $2D_o/3\times(1-6\%)=5000$ Å instead of $2D_o/3=4600$ Å, which provides a much improved fit at short wavelengths.

The wavelength of light emitted by an OLED in a SOLED is shifted when there is a transmission peak that overlaps the emission spectra of the OLED, but is not centered on the emission spectra of the OLED. The amount of the shift depends on how close the transmission peak is to the emission spectra peak and the width of the peaks. A laser, for example, with a very narrow peak, would not be shifted by any transmission function. A SOLED that does not shift the wavelength of light emitted by the stacked OLEDS can therefore be designed by selecting a transmission function that, for each OLED, either 1) has a transmission peak centered on the emission spectra of the OLED, or 2) does not have a transmission peak that overlaps the transmission spectra of the OLED.

For SOLED 200, the strongest interference effects are due to second electrode 206, a layer of Mg:Ag about 120 Å thick, and fourth electrode 212, a layer of Mg:Ag about 1500 Å thick, with reflective cap 213. Fourth electrode 212 with reflective cap 213 reflects almost all light incident thereon. The reflectance of second electrode 206 is very sensitive to the Mg:Ag ratio, and ranges from about 40% to 70%. The effect of other factors that contribute to interference, such as the position of an EL relative to the reflective layers, absorption of light, polarization, and reflection of light transmitted at an angle not normal to the layers of SOLED 200, are small when compared to the effect of the reflectance due to second electrode 206 and fourth electrode 212 with reflective cap 213. It is therefore possible to model the interference caused by SOLED 200 fairly accurately using the following assumptions: 1) all interference is due to second electrode 206 and fourth electrode 212 with reflective cap 213, which define an optical cavity; 2) the position of an EL within the optical cavity does not affect the transmission function; 3) index of refraction does not vary between organic (ETL, EL and HLT) layers, i.e. there is no reflection at the boundaries between organic layers; 4) all light is transmitted normal to the layers of OLED 200; and 5) polarization has no effect. The only variables are the reflectivities of second electrode 206 and fourth electrode 212 with reflective cap 213, and the optical path length of the optical cavity. These assumptions are used in calculating the transmission functions used to generate the calculated emission spectra shown in FIGS. 4, 5 and 6.

Figure 5:
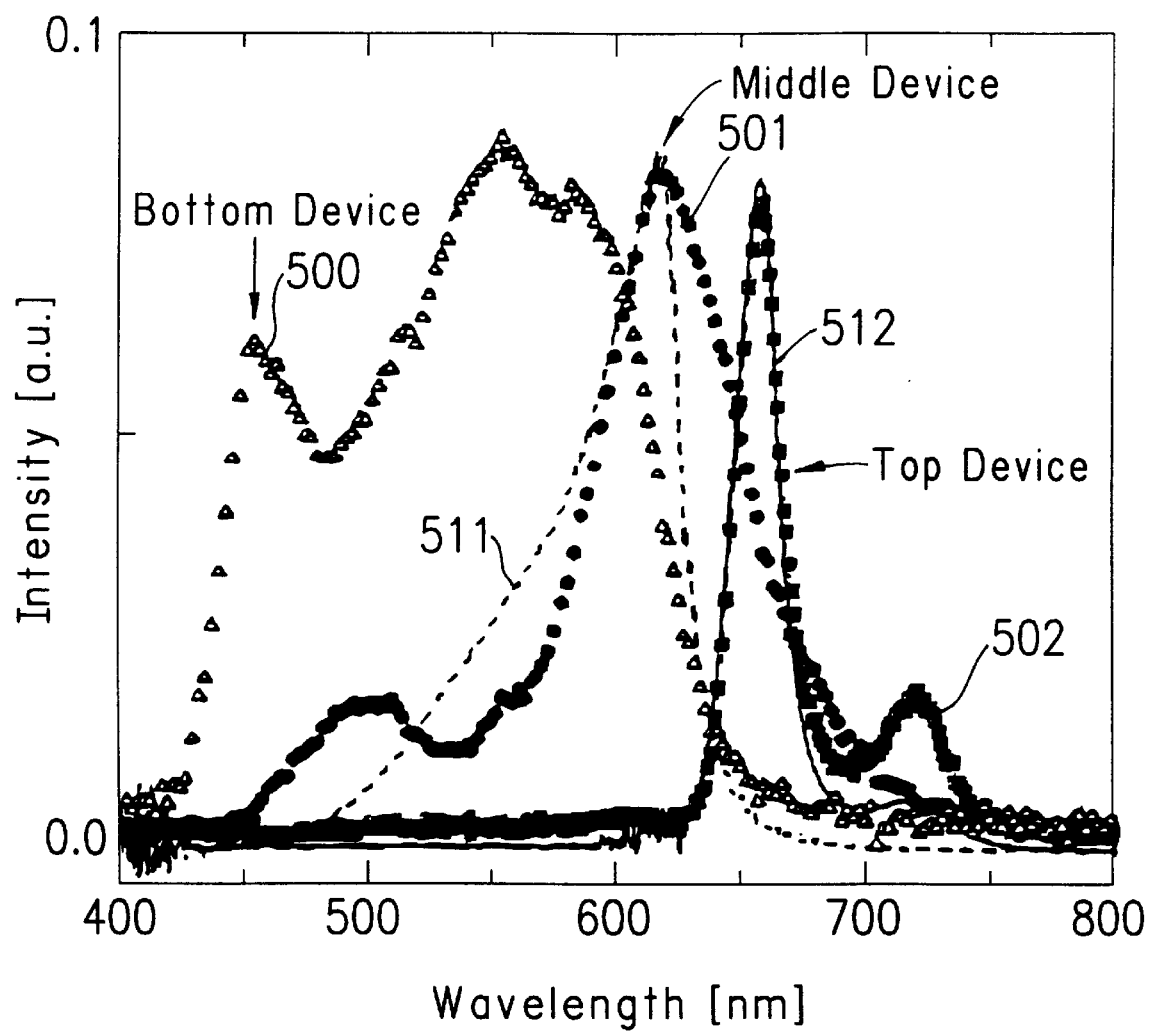
FIG. 5 shows measured emission spectra for red, green and blue emitting layers in an exemplary SOLED in accordance with the present invention, as well as calculated emission spectra.
Figure 6:
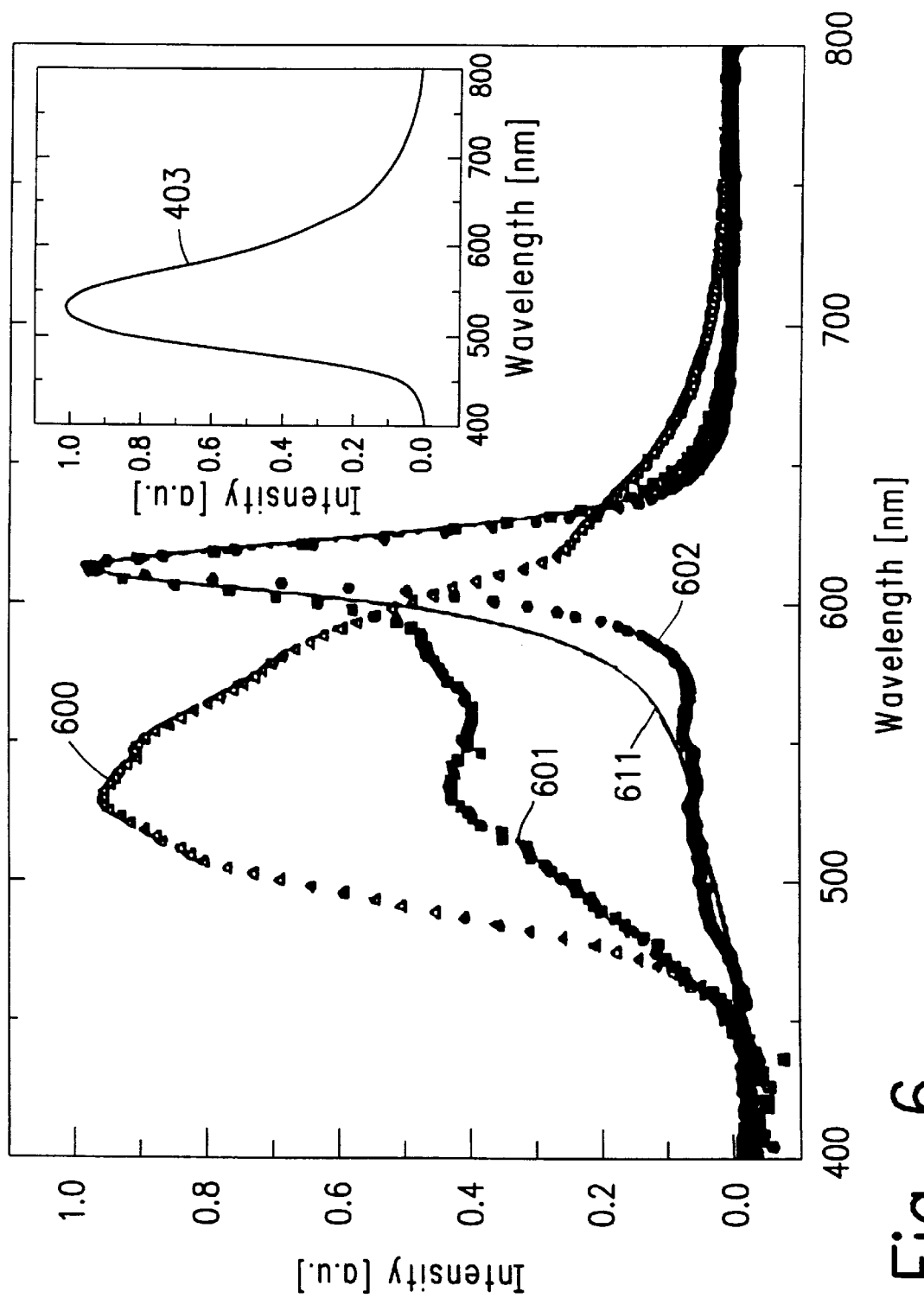
FIG. 6 shows measured emission spectra for three separate green emitting layers in a further exemplary SOLED in accordance with the present invention, as well as calculated emission spectra.

When the above-mentioned assumptions are made, the effect of SOLED 200 on emissions from OLED 220, which is outside of the optical cavity formed by electrodes 206 and 212, is not accurately modeled. FIGS. 4, 5, and 6 therefore do not show calculated spectra for EL 220. However, peaks of the measured emission spectra of middle OLED 221 and top OLED 222 correspond to dips in the spectra of bottom OLED 220, as illustrated by plot 410 of FIG. 4, plot 500 of FIG. 5, and plot 600 of FIG. 6. This shows that the emission spectrum of the OLED 220 is affected by the optical cavity even though OLED 220 is not in the cavity. At the cavity transmission peak wavelength, less light of the bottom element is reflected, leading to loss in the bottom element spectrum. However, these dips are too pronounced to be accurately fit by the simple model discussed above.

Figure 4A:
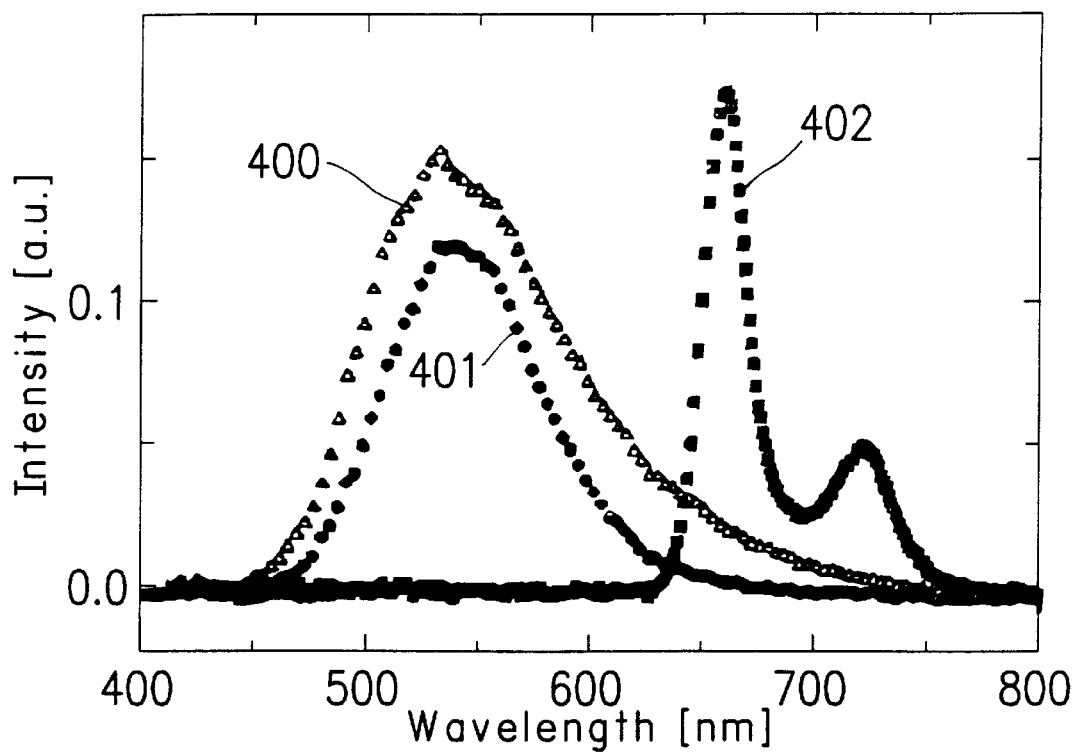
FIG. 4a shows measured emission spectra for discrete red, green and blue OLEDs.

FIG. 4a shows measured emission spectra $I_0(\lambda)$ for discrete OLEDs (not shown). The discrete OLEDs used to generate the measured emission spectra of FIG. 4a were fabricated simultaneously with SOLED 200. Intensity has been normalized, and is plotted in arbitrary units (a.u.). Plot 400 is an emission spectrum, which would appear blue to a viewer, for a discrete, non-stacked, OLED (not shown), using the same EL as bottom OLED 220. Plot 401 is an emission spectrum, which would appear green to a viewer, for a discrete OLED (not shown), not stacked, using the same EL as middle OLED 221. Plot 402 is the emission spectrum, which would appear red to a viewer, for a discrete OLED (not shown), not stacked, using the same EL as top OLED 222.

Figure 4B:
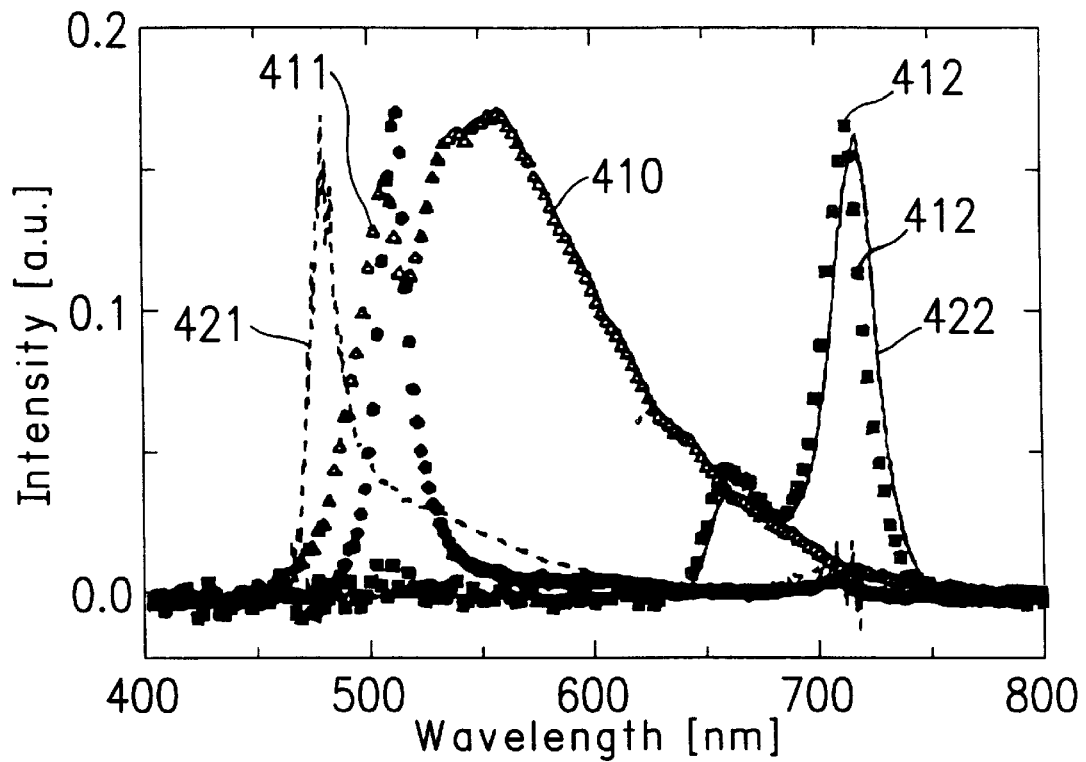
FIG. 4b shows measured emission spectra for red, green and blue emitting layers in the SOLED of FIG. 2, as well as calculate emission spectra.

FIG. 4b shows measured emission spectra plots 410, 411 and 412, shown as discrete data points, for OLEDs 220, 221 and 222 respectively, fabricated as a SOLED in accordance with FIG. 2. Intensity has been normalized, and is plotted in arbitrary units. If the multi-layer structure of SOLED 200 did not have any filtering effect on the light emitted by OLEDs 220, 221 and 222, FIGS. 4a and 4b would be identical, with plots 400, 401 and 402 of FIG. 4a corresponding to plots 410, 411 and 412 of FIG. 4b, respectively. Due to the filtering of SOLED 200, the absolute intensity of the output of OLEDs 220, 221 and 222, used to generate plots 410, 411 and 412, was less than the intensity of the output of the discrete OLEDs used to generate plots 400, 401 and 402. The difference in intensity is not reflected by the plots of FIGS. 4a and 4b, which have been normalized.

FIGS. 4a and 4b can be compared to show how SOLED 200 acts as a filter that attenuates some frequencies of light more than others, and effectively shifts the wavelength of light emitted by OLEDs 220, 221 and 222. For example, the shorter wavelengths emitted by OLED 220, between about 450 and 525 nm, are attenuated by SOLED 200 more than longer wavelengths above about 525 nm. Plot 410 is therefore shifted to higher wavelengths relative to plot 400, and OLED 220 appears greener as a part of SOLED 200 than as a discrete device. The upper wavelengths emitted by OLED 221, above about 525 nm, are attenuated by SOLED 200 more than lower wavelengths. Plot 411 is therefore shifted to lower wavelengths relative to plot 401, and OLED 221 appears bluer as a part of SOLED 200 than as a discrete device. The lower wavelengths emitted by OLED 222, around about 670 nm, are attenuated by SOLED 200 more than higher wavelengths. Plot 412 is therefore shifted to higher wavelengths relative to plot 402, and the emissions of OLED 222 are closer to infrared as a part of SOLED 200 than as a discrete device.

Plots 421 and 422, shown in FIG. 4b as a dashed and a solid line, respectively, are calculated emission spectra $I(\lambda)$ for OLEDs 221 and 222. $I(\lambda)=T(\lambda)I_0(\lambda)$, where $T(\lambda)$ is a calculated transmission function and $I_0(\lambda)$ is the measured emission spectra for a discrete device, is plotted in FIG. 4a. The transmission function $T(\lambda)$ (not shown) was calculated for FIG. 4 using a reflectivity R of 99% for fourth electrode 212 with reflecting cap 213, a reflectivity R of 70% for second electrode 206, and an optical path length of 7000 Å between the reflecting layers. Calculated plot 422 is a good match with measured plot 412, showing that the model, even with simplifying assumptions, works well.

Plots 421 and 422 are calculated based on the assumption that index of refraction does not vary with wavelength. However, as discussed above, the color dispersion away from the absorption region of the wavelength peak results in an index of refraction which actually follows Cauchy's Equation: $n=A+B/\lambda^2+C/\lambda^4$, such that n is larger at shorter wavelengths. Correcting for variations in index of refraction with wavelength would lead to a better fit between plots 421 (calculated) and 411 (measured).

FIG. 5 is a plot of spectra emitted by a SOLED Jan. 15, 1997, as well as fit spectra. SOLED Jan. 15, 1997 is similar to SOLED 200 as depicted in FIG. 2(a). However, the materials and thicknesses of SOLED Jan. 15, 1997 are different than those of SOLED 200.

Plots 500, 501 and 502, shown as a series of discrete points, are the measured emission spectra of bottom OLED 220, middle OLED 221 and top OLED 222, respectively, of SOLED Jan. 15, 1997. Plots 511 and 512, shown as a dashed line and a solid line, are calculated spectra for middle OLED 221 and top OLED 222, respectively, of SOLED Jan. 15, 1997. Plots 511 and 512 are calculated by multiplying the emission spectra for discrete OLEDs, as shown by plots 401 and 402, respectively, by a transmission function (not shown) based on a reflectivity of 50% for second electrode 206, a reflectivity of 99% for fourth electrode 212 with reflective cap 213, and an optical cavity size of 6170 Å. Calculated plots 511 and 512 are good matches with measured plots 501 and 502, showing that the model, even with simplifying assumptions, works well.

FIG. 6 is a plot of spectra emitted by a SOLED Jan. 13, 1997, as well as fit spectra. SOLED Jan. 13, 1997 is similar to SOLED 200 as depicted in FIG. 2. However, the materials and thicknesses of SOLED Jan. 13, 1997 are different than those of SOLED 200.

The emitting layers of OLEDs 220, 221 and 222 of SOLED Jan. 13, 1997 are substantially identical, and would be expected to emit green light with identical spectra, as shown by plot 403 in the inset, if fabricated as discrete devices. Plots 600, 601 and 602, shown as a series of discrete points, are the measured emission spectra of bottom OLED 220, middle OLED 221 and top OLED 222, respectively, of SOLED Jan. 13, 1997. Plot 611, shown as a solid line, is a calculated spectrum for middle OLED 221 and top OLED 222 of SOLED Jan. 13, 1997. Plot 611 is calculated by multiplying the emission spectrum, as shown by plot 403, for discrete OLED 221, which in the case of SOLED Jan. 13, 1997 is the same as the emission spectrum for discrete OLED 222, by a transmission function (not shown) based on a reflectivity of 66% for second electrode 206, a reflectivity of 99% for fourth electrode 212 with reflective cap 213, and an optical cavity size of 6170 Å. Calculated plot 611 is a good match with measured plots 601 and 602, showing that the model, even with simplifying assumptions, works well. Calculated plot 611 corresponds to both measured plots 601 and 602 because the position of OLEDs 121 and 122 within the optical cavity is not considered due to simplifying assumptions made in calculating the transmission function.

The width of the emission spectrum of a red OLED, as shown by plot 402, is narrower than the emission spectrum of a blue or green OLED, as shown by plots 400 and 401. As a result, the red emission spectrum is not as strongly affected by the SOLED structure unless the cavity resonance wavelength is very close to its emission spectral double peaks. For example, the spectra of SOLED 200 (FIG. 4) shows the case where the cavity resonance wavelength is tuned to coincide with the infrared peak of the red emission spectrum, and therefore causes energy redistribution between the double spectral peaks, as shown by comparing plot 402 with plot 412. On the other hand, the spectra of sample Jan. 15, 1997 shows the case where the cavity resonance peak is away from the red emission peak, and the emission spectrum of the red OLED is not shifted or redistributed, as shown by comparing plots 402 and 502. However, the external efficiency measured from the forward direction may be lowered (Eq. 19). In this case, the output light is redistributed spatially such that a slightly larger portion of the light is waveguided by the glass substrate.

Plots 600, 601 and 602 are the measured emission spectra of three identical OLEDs 220, 221 and 222 positioned differently within SOLED Jan. 13, 1997. If fabricated as discrete devices, OLEDs 220, 221 and 222 of SOLED Jan. 13, 1997 should have identical spectra, as shown in plot 604. However, plot 600 is broader than that expected from an equivalent, discrete device, whereas plots 601 and 602 are substantially red-shifted and narrowed. The optical cavity formed by second electrode 206 and fourth electrode 212 with reflective cap 213 has an optical path length of about 6170 nm., which is very close to the wavelength of the shifted emission peak. Futhermore, the absorbance of PTCDA is large at wavelengths shorter than 6000 Å, which is also partially responsible for the "red shift" of the green emission.

Figure 7:
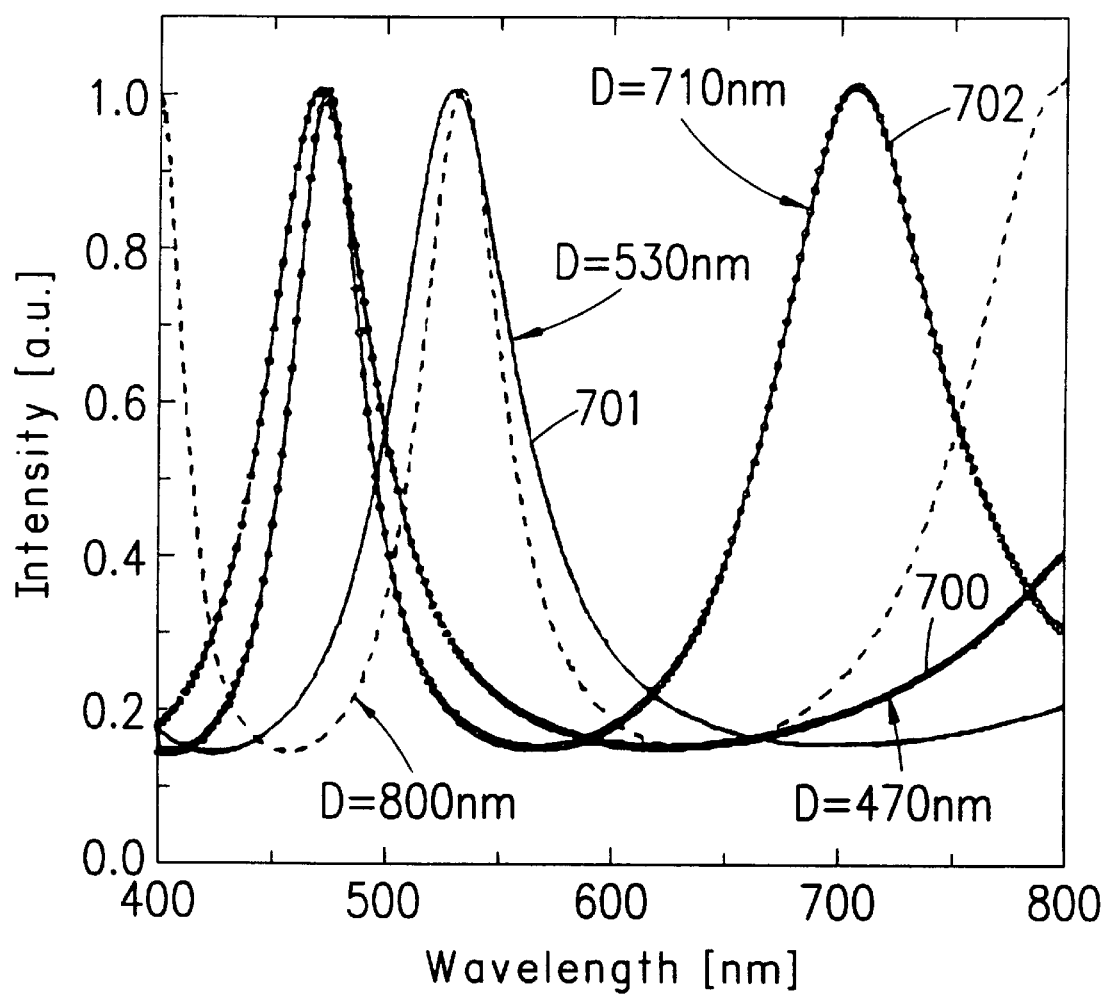
FIG. 7 shows exemplary transmission characteristics for a single optical cavity.

FIG. 7 shows plots of the transmission functions of single optical cavities formed by second electrode 206 and fourth electrode 212 with reflective cap 213 of SOLED 200. The transmission functions of FIG. 7 are calculated using a reflectivity of 99% for fourth electrode 212 with reflective cap 213, and a reflectivity of 50% for second electrode 206, and based on a light source positioned at the edge of the optical cavity. For a light source positioned at the edge of the optical cavity, transmission peaks are at $\lambda=2D/j$, where D is the optical path length, $\lambda$ is wavelength, and j is an integer indexing variable (i.e. j=1,2,3 . . . ). The different plots are for different optical path lengths D, as follows: plot 700, optical path length=470; plot 701, optical path length=530; plot 702, optical path length=710; plot 703, optical path length=800. Multiplying a transmission function by the emission spectra of a discrete OLED gives the expected emission spectra from the OLED as a part of a SOLED. Transmission spectra similar to those of FIG. 7, but calculated using the various optical path lengths and reflectivities as discussed, were used to generate calculated plots 411, 412, 511, 512 and 611.

The plots of FIG. 7 allow a first order prediction of film thicknesses that will optimize RGB emission color saturation from a SOLED. Assuming the emission spectra of OLED 220 to be unaffected by SOLED 200, the structure of SOLED 200 allows several choices for manipulating the cavity optical path length of the middle and top elements that does not lead to shifts in the emission spectra of OLEDs 220, 221 and 222: 1) OLED 220, outside of the optical cavity, emits blue, and OLEDs 221 and 222 emit green and red, where D=about 530 nm, such that transmission peaks occur at $\lambda_n$=1060 nm, 530 nm, 353 m . . . , and the only transmission peak in the visible spectral range is at 530 nm; the emission of the red OLED will be attenuated, but not shifted, and a more saturated green peak is obtained due to the transmission peak at 530 nm; or 2) OLED 220, outside of the optical cavity, emits green, and OLEDs 221 and 222 emit blue and red, where D=about 475 nm, such that transmission peaks occur at $\lambda_n$=950 nm, 475 nm, 317 m . . . , and the only transmission peak in the visible spectral range is at 475 nm. The emission of the red OLED will be attenuated, but not shifted, and a more saturated blue peak is obtained due to the transmission peak at 475 nm. A cavity including red and blue OLEDs, with a length of D=712 nm and having transmission peaks at $\lambda_n$=142 nm, 712 nm, 475 nm, 356 nm . . . , would affect the performance of the red element, while producing a more saturated blue. A cavity including red and green OLEDs, with a length of D=880 nm and having transmission peaks at $\lambda_n$=1600 nm, 800 nm, 533 nm, 475 nm . . . would also affect the performance of the red OLED, while producing a more saturated green.

A different assumption regarding light source positioning would lead to a different transmission function. The position dependence of the transmission spectrum can be illustrated by studying a light source in a single layer cavity of optical path D, where the light is emitted at a distant $x^+$ below the top edge and $x^-$ above the bottom edge of the cavity, (such that $x^+ + x^- = D$). The photon emission should be isotropic, i.e., $E_{emit} = E_{emit}$. Therefore, when the light emerges from the top of the cavity, there is always a phase difference of $\Delta = k(D + x^- - x^+)$, between the two beams, whereas the phase difference of light from the bottom is $\Delta = k(D + x^- - x^+)$, where $k = 2\pi/\lambda$. As a result, the transmission is high when both $\Delta = (2n \pm \epsilon\Delta) b\pi$ and $\beta = k D = (n \pm \epsilon_\beta)\pi$ are satisfied, where $\epsilon\Delta$, $\epsilon_\beta \ll 1$ depending on the values of the reflectivity. That is, a very high reflectivity requires small values of $\epsilon\Delta$, and $\epsilon_\beta$. On the other hand, at moderate values of reflectivity, $\epsilon_\Delta$, and $\epsilon_o$ can be larger, leading to transmission peaks at wavelengths away from $\lambda = 2D/n$. A straightforward example is a light source located at the center of the cavity, such that $\Delta = kD$. Transmission, in this case, peaks only at $\lambda = D/n$ instead of at the otherwise expected $\lambda = 2D/n$.

Figure 8:
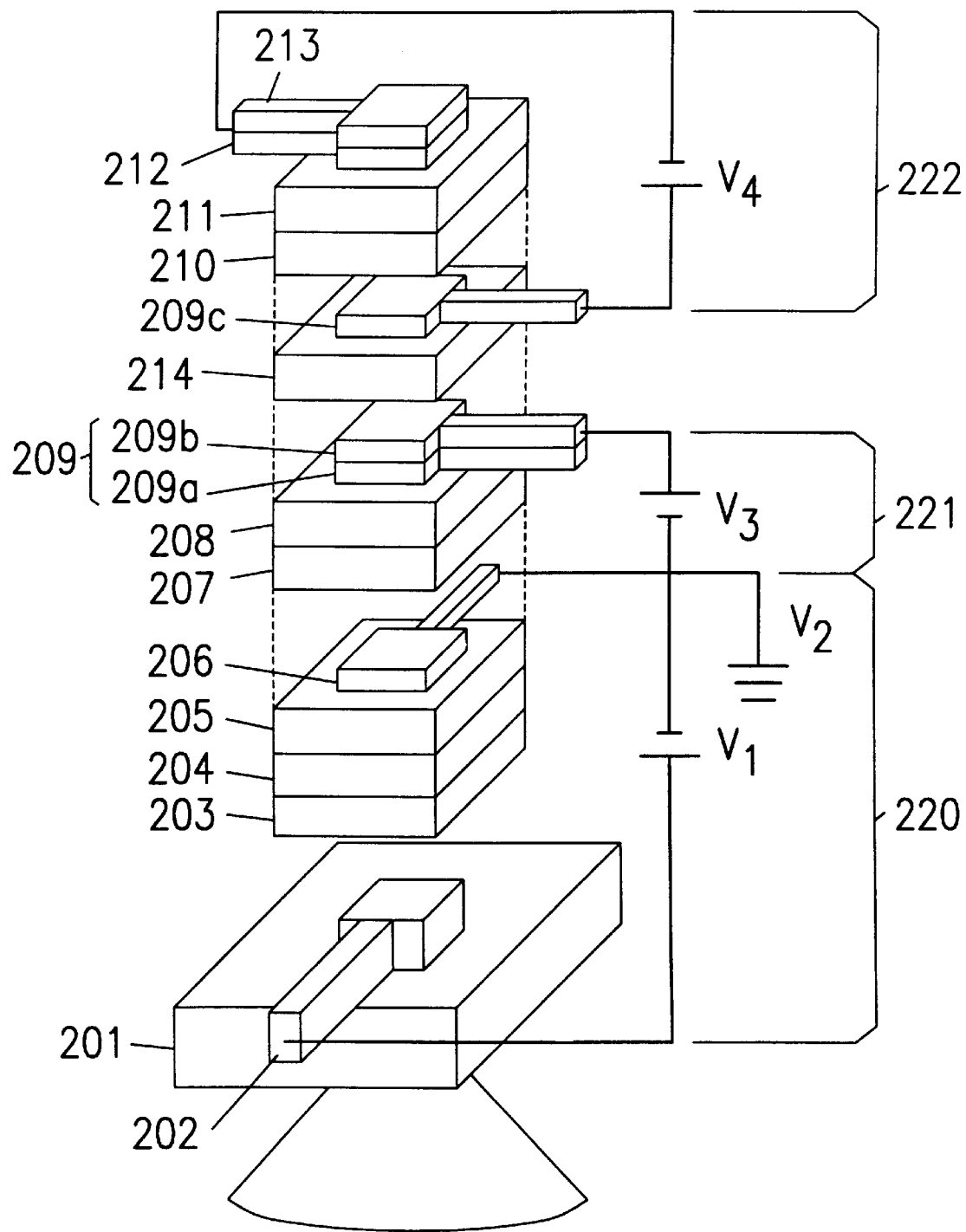
FIG. 8 is a schematic representation of a three color tunable SOLED that incorporates an insulating layer that may be used to control the position of light sources within an optical cavity.

Using such detailed analysis, better fits to the SOLED stacks can be obtained. A preferred embodiment, as shown in FIG. 8, allows cavity length and positions of the emitters to be controlled and chosen to optimize the transmission of all three color elements in the multi-color stack. An insulating dielectric layer 214, made of a material such as $SiO_2$ or $SiN_x$, that may be used to shift the positions of the light source within the optical cavity defined by second electrode 206 and fourth electrode 212 with reflective cap 213. An additional third electrode (top) 209c, separated from third electrode 209b by insulating layer 214, serves in place of electrode 209b in OLED 222.

FIG. 9 shows transmission functions calculated taking into account absorption by the Mg:Ag and PTCDA layers, (where the other organic layers are all assumed to be transparent), interference due to each dielectric film, light source positioning, off-axis viewing, and the behavior of different light polarizations. A simplified assumption considering only the index discontinuities at the Mg:Ag— organic interfaces can be applied since the reflectivity r is far larger than that at any other interface. The transmission functions of FIG. 9 are based on a SOLED defined as follows: (1) an optical cavity having an optical path length of 700 nm defined by a second electrode 206 and a fourth electrode 212 with reflecting cap 213; (2) a third EL 211 having a red light source located 160 nm below the reflecting surface of fourth electrode 212 with reflecting cap 213; (3) a second EL 207 having a blue light source located 180 nm above the reflecting surface of second electrode 206; and (4) a first EL 204 having a green light source located 150 nm below the reflecting surface of second electrode 206. Plots 900, 901 and 902 (shown as solid lines) show the transmission functions for second EL 207 (blue), first EL 204 (green), and third EL 211 (red), repectively. The configuration of the SOLED used to generate the transmission function of FIG. 9 is a preferred embodiment, because transmission function is tuned to peak at 500 nm, 530 nm and 670 nm for the blue, green and red OLEDs, respectively, leading to good color saturation as well as high external quantum efficiency.

Plots 900, 901 and 902 are transmission functions for light as viewed from a direction normal to the plane of the SOLED layers (for example, EL 204). Plots 910, 911 and 912 (shown as dashed lines) are the corresponding transmission functions for light viewed from a direction 3 degrees off from the normal direction. In the embodiment of FIG. 9, a slight shift in the wavelength of transmitted light will occur as the viewing angle changes. A large shift in the wavelength of transmitted light with viewing angle is undesirable, because a large shift will result in different colors being perceived by viewers at different angles. The present invention can be used to determine a SOLED configuration that minimizes such a shift.

The subject invention as disclosed herein may be used in conjunction with co-pending applications: "High Reliability, High Efficiency, Integratable Organic Light Emitting Devices and Methods of Producing Same",Ser. No. 08/774,119 (filed Dec. 23, 1996); "Novel Materials for Multicolor LED's", Attorney Docket No. 10020/24 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Attorney Docket No. 10020/21 (filed Apr. 14, 1997); "Light Emitting Devices Having High Brightness", Attorney Docket No. 10020/16 (filed Apr. 18, 1997); and "Organic Semiconductor Laser", Attorney Docket No. 10020/23 (filed May 19, 1997), each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

We claim:

1. A stacked light emitting device comprising:
   a first light emitting device;
   a first reflective layer arranged on the first light emitting device, the first reflective layer having a first reflectance;
   a second light emitting device arranged over the first reflective layer; and
   a second reflective layer arranged over the second light emitting device, the second reflective layer having a second reflectance,
   wherein the first and second reflective layers delimit an optical cavity, the optical cavity having a transmittance which dependant on the first and second reflectances and on an optical path length of the optical cavity, and
   wherein the optical path length and the first and second reflectances are selected so that the transmittance of the optical cavity has a predetermined characteristic.

2. The device of claim 1, wherein the transmittance of the optical cavity has a filtering characteristic.

3. The device of claim 1, further including a third light emitting device arranged between second light emitting device and the second reflective layer.

4. The stacked light emitting device of claim 3 wherein the optical path length and first and second reflectances are selected to produce an optical cavity having a transmission peak centered on the emission spectrum of the first, second or third light emitting device.

5. The stacked light emitting device of claim 3 wherein the optical path length and first and second reflectances are selected to produce an optical cavity having a transmission peak centered at about 475, 500, 530 or 670 nm.

6. The stacked light emitting device of claim 3 wherein the optical path length and first and second reflectances are selected to produce an optical cavity having a transmission peak having no overlap with the emission spectrum of the first light emitting device.

7. The stacked light emitting device of claim 3 wherein the optical path length and first and second reflectances are selected to produce an optical cavity having a transmission peak having no overlap with the emission spectrum of the second light emitting device.

8. The stacked light emitting device of claim 3 wherein the optical path length and first and second reflectances are selected to produce an optical cavity having a transmission peak having no overlap with the emission spectrum of the third light emitting device.

9. The stacked light emitting device of claim 3 wherein the optical path length and first and second reflectances are selected to produce an optical cavity that shifts the emission spectrum of the first, second or third light emitting device so as to increase the color saturation of the light produced from the stacked device by the first, second or third light emitting device, respectively.

10. The stacked light emitting device of claim 3 wherein the optical path length and first and second reflectances are selected to produce an optical cavity that maximizes the external quantum efficiency of the first, second or third light emitting device.

11. The stacked light emitting device of claim 3 wherein the optical path length and first and second reflectances are selected to produce an optical cavity that minimizes the shift in wavelength of the transmitted light with viewing angle of the light obtained from the first, second or third light emitting device.

12. The stacked light emitting device of claim 3 wherein the first light emitting device emits blue light, the second light emitting device emits green light and the third light emitting device emits red light, wherein the optical cavity has an optical path length of about 530 nm.

13. The stacked light emitting device of claim 3 wherein the first light emitting device emits green light, the second light emitting device emits blue light and the third light emitting device emits red light.

14. The stacked light emitting device of claim 13 wherein the optical cavity has an optical path length of about 475 nm.

15. The stacked light emitting device of claim 3 wherein the first light emitting device emits green light, the second light emitting device emits red light and the third light emitting device emits blue light.

16. The stacked light emitting device of claim 15 wherein the optical cavity has an optical path length of about 712 nm.

17. The stacked light emitting device of claim 3 wherein the first light emitting device emits blue light, the second light emitting device emits red light and the third light emitting device emits green light.

18. The stacked light emitting device of claim 17 wherein the optical cavity has an optical path length of about 880 nm.

19. The stacked light emitting device of claim 1 wherein the optical path length and first and second reflectances are selected to produce an optical cavity having a transmission peak centered on the emission spectrum of the first or second light emitting device.

20. The stacked light emitting device of claim 1 wherein the optical path length and first and second reflectances are selected to produce an optical cavity having a transmission peak centered at about 475, 500, 530 or 670 nm.

21. The stacked light emitting device of claim 1 wherein the optical path length and first and second reflectances are selected to produce an optical cavity having a transmission peak having no overlap with the emission spectrum of the first light emitting device.

22. The stacked light emitting device of claim 1 wherein the optical path length and first and second reflectances are selected to produce an optical cavity having a transmission peak having no overlap with the emission spectrum of the second light emitting device.

23. The stacked light emitting device of claim 1 wherein the optical path length and first and second reflectances are selected to produce an optical cavity that shifts the emission spectrum of the first light emitting device so as to increase the color saturation of the light produced from the stacked device by the first light emitting device.

24. The stacked light emitting device of claim 1 wherein the optical path length and first and second reflectances are selected to produce an optical cavity that shifts the emission spectrum of the second light emitting device so as to increase the color saturation of the light produced from the stacked device by the second light emitting device.

25. The stacked light emitting device of claim 1 wherein the optical path length and first and second reflectances are selected to produce an optical cavity that maximizes the external quantum efficiency of the first or second light emitting device.

26. The stacked light emitting device of claim 1 wherein the optical path length and first and second reflectances are selected to produce an optical cavity that minimizes the shift in wavelength of the transmitted light with viewing angle of the light obtained from the first or second light emitting device.

27. An apparatus selected from the group consisting of: a display, a vehicle, a television, a computer, a printer, a screen, a sign, a telecommunications device, and a telephone, wherein the apparatus incorporates the device of claim 1.

* * * * *

UNITED STATES PATENT AND TRADEMARK OFFICE
CERTIFICATE OF CORRECTION

PATENT NO. : 5,932,895
DATED : August 3, 1999
INVENTOR(S) : Zilan Shen, et. al.

It is certified that error appears in the above-identified patent and that said Letters Patent is hereby corrected as shown below:

Column 1, line 6, after "awarded" insert -- by --.

Column 2, line 56, change "calculate" to -- calculated --.

Column 3, line 22, after "display." delete "SOLED 200 is fabricated on substrate".

Column 3, line 23, before "201" insert -- SOLED 200 is fabricated on substrate --.

Column 5, line 1, change "$i_m$-1" to -- $i_{m-1}$ --.

Column 5, line 24, change "S" to -- s --.

Column 6, line 3, change "$[E^-_{m-1,p} - E^+_{m-1,p} \exp(-\delta_{m-1})]$..." to -- $[E^-_{m-1,p} - E^+_{m-1,s} \exp(-\delta_{m-1})]$.

UNITED STATES PATENT AND TRADEMARK OFFICE
CERTIFICATE OF CORRECTION

PATENT NO. : 5,932,895
DATED : August 3, 1999
INVENTOR(S) : Zilan Shen, et. al.

It is certified that error appears in the above-identified patent and that said Letters Patent is hereby corrected as shown below:

Column 7, line 5, after "p(z)" insert -- $\propto$ --.

Column 8, line 14, delete "15".

Column 8, line 25, change "n=A+B/$\lambda^2$ +C/X$^4$ " to -- n=A+B/$\lambda^2$+C/$\lambda^4$ --.

Column 12, line 8, change "353m" to -- 353nm --.

Column 12, line 26, change "475nm" to -- 400nm --.

Column 12, line 40, change "b $\pi$" to -- $\pi$ --.

Signed and Sealed this

Twenty-fifth Day of July, 2000

Attest:

Q. TODD DICKINSON

*Attesting Officer*  *Director of Patents and Trademarks*